US007129619B2

(12) United States Patent
Yang et al.

(10) Patent No.: US 7,129,619 B2
(45) Date of Patent: Oct. 31, 2006

(54) ULTRASONIC NEBULIZER FOR PRODUCING HIGH-VOLUME SUB-MICRON DROPLETS

(75) Inventors: Che-Hua Yang, Shindian (TW); Hsiu-Kang Chang, Taipei (TW); Tiao-Ling Hsieh, Ilan (TW); Kun-Yi Tsai, Kaohsiung (TW)

(73) Assignee: Purzer Pharmaceutical Co., Ltd., Taipei (TW)

( * ) Notice: Subject to any disclaimer, the term of this patent is extended or adjusted under 35 U.S.C. 154(b) by 514 days.

(21) Appl. No.: 10/617,796

(22) Filed: Jul. 14, 2003

(65) Prior Publication Data

US 2004/0099218 A1 May 27, 2004

(30) Foreign Application Priority Data

Nov. 12, 2002 (TW) .............................. 91133195 A

(51) Int. Cl.
*H01L 41/04* (2006.01)

(52) U.S. Cl. ................ 310/317; 239/102.1; 239/102.2; 239/101; 239/338; 239/337; 128/200.12; 128/200.14; 128/200.16

(58) Field of Classification Search ................ 455/265, 455/255, 256, 575.1, 67.12, 75, 95, 556.2, 455/136, 164.1, 162.1, 147, 163.1, 164.2, 455/318, 319; 331/73, 74, 67, 109, 68, 116 R, 331/117 R, 76; 310/317, 316.01, 318, 311; 424/45, 46, 426, 434, 435, 489, 490; 128/200.16, 128/200.14, 203.12, 200.11, 200.13, 200.12; 239/4, 102.2, 102.1; 118/726, 715
See application file for complete search history.

(56) References Cited

U.S. PATENT DOCUMENTS

| | | | | |
|---|---|---|---|---|
| 3,839,651 | A * | 10/1974 | Michaels | 327/512 |
| 4,318,062 | A * | 3/1982 | Mitsui et al. | 331/109 |
| 4,319,155 | A * | 3/1982 | Nakai et al. | 310/316.01 |
| 4,338,576 | A * | 7/1982 | Takahashi et al. | 331/67 |
| 4,641,053 | A * | 2/1987 | Takeda | 310/317 |
| 4,703,213 | A * | 10/1987 | GaHerbert | 310/316.01 |
| 5,136,199 | A * | 8/1992 | Kawai | 310/317 |
| 5,303,585 | A * | 4/1994 | Lichte | 73/290 V |
| 5,551,416 | A * | 9/1996 | Stimpson et al. | 128/200.16 |
| 5,563,811 | A * | 10/1996 | Embree | 702/86 |
| 6,357,671 | B1 * | 3/2002 | Cewers | 239/102.2 |
| 6,946,117 | B1 * | 9/2005 | Schutt et al. | 424/45 |
| 2003/0127535 | A1 * | 7/2003 | Adiga et al. | 239/102.1 |

* cited by examiner

*Primary Examiner*—Edward F. Urban
*Assistant Examiner*—Charles Chow
(74) *Attorney, Agent, or Firm*—Bacon & Thomas, PLLC

(57) ABSTRACT

An ultrasonic nebulizer for producing high-volume sub-micron droplets is disclosed. The ultrasonic nebulizer utilizes a 3 or 5 MHz frequency as an oscillation frequency for producing sub-micron droplets. The nebulizer can also use at least one piezoelectric ceramic oscillator for increasing the volume of the droplets. The ultrasonic nebulizer comprises an ac/dc converter, an oscillator circuit, an amplifying device, a nebulization chamber, and at least one piezoelectric ceramic oscillator. The ac/dc converter rectifies an ac current to a dc current. The oscillator circuit produces an oscillation signal with a frequency larger than or equal to 3 MHz. The amplifying device amplifies the oscillation signal. The nebulization chamber has a lower face for holding a liquid to be nebulized. At least one piezoelectric ceramic oscillator is formed on the lower face of the nebulization chamber and connected to the amplified signal providing an ultrasonic output to cause nebulization for producing high-volume sub-micron droplets.

5 Claims, 3 Drawing Sheets

PIEZDELECTRIC CERAMIC OSCILLATOR*4

ULTRASONIC NEBULIZER FOR PRODUCING HIGH-VOLUME SUB-MICRON DROPLETS

BACKGROUND OF THE INVENTION

1. Field of the Invention

The present invention relates to the technical field of ultrasonic nebulizers and, more particularly, to an ultrasonic nebulizer for producing high-volume sub-micron droplets.

2. Description of Related Art

An ultrasonic nebulizer uses an oscillation signal to drive a piezoelectric ceramic oscillator for producing mechanical vibration. The vibration energy is coupled to a liquid to be nebulized for producing capillary waves thereon and droplets. The ultrasonic nebulizer can be used for medication or producing droplet applications. Generally an oscillation frequency of a conventional ultrasonic nebulizer is 1.6 MHz or 2.4 MHz. As shown in FIG. 1, the average diameter of droplets produced by a conventional ultrasonic nebulizer at 1.6 MHz and 2.4 MHz are 2.3 μm and 1.7 μm respectively. The droplets with a diameter of 2.3 μm and 1.7 μm are too large for treatment of an alveolus. In general, the droplets with a diameter large than 1.0 μm are easily absorbed by a bronchus or bronchioles before entering the alveolus. On the contrary, most droplets with a diameter less than 1.0 μm easily pass through the bronchus or bronchioles and are absorbed by the alveolus. FIG. 1 shows that the total quantity of droplets with a diameter less than 1.0 μm is very little for a conventional nebulizer with a 2.4 MHZ oscillation frequency, and therefore the total volume of the droplets entering the alveolus is also very little and is not suitable for treating an alveolus. However, if the oscillation frequency can be changed to 5 MHz, then the volume of the droplets with a diameter less than 1.0 μm can be dramatically increased for treating the alveolus. Therefore, there is a need to have a novel design for a nebulizer that can mitigate and/or obviate the aforementioned problems.

SUMMARY OF THE INVENTION

The object of the present invention is to provide an ultrasonic nebulizer for producing high-volume sub-micron droplets.

With this object in view, the present invention provides an ultrasonic nebulizer for producing high-volume sub-micron droplets. The ultrasonic nebulizer comprises an ac/dc converter, an oscillator circuit, an amplifying device, a nebulization chamber, and at least one piezoelectric ceramic oscillator. The ac/dc converter rectifies an ac current to a dc current and provides a dc voltage. The oscillator circuit powered by the dc voltage produces an oscillation signal with a frequency larger than or equal to 3 MHz. The amplifying device is connected to the oscillator circuit for amplifying the oscillation signal. The nebulization chamber has a lower face for holding a liquid to be nebulized. At least one piezoelectric ceramic oscillator is formed on the lower face of the nebulization chamber and electrically connected to the amplified signal providing an ultrasonic output to cause nebulization for producing high-volume sub-micron droplets.

Other objects, advantages, and novel features of the invention will become more apparent from the following detailed description when taken in conjunction with the accompanying drawings.

DETAILED DESCRIPTION OF THE PREFERRED EMBODIMENT

Figure 1:
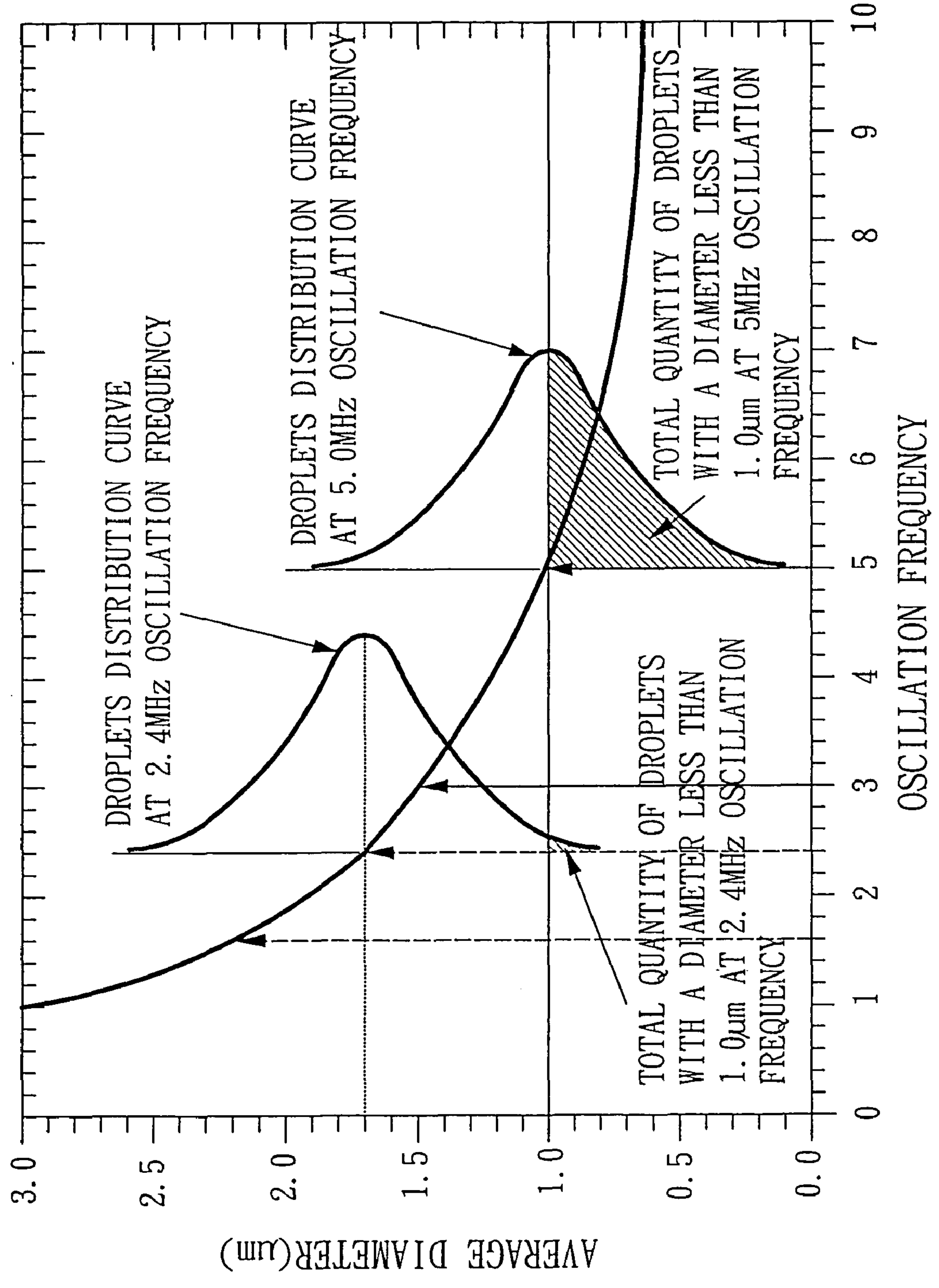
FIG. 1 shows a relationship of an average diameter of droplets and droplet distribution vs. oscillation frequency.
Figure 2:
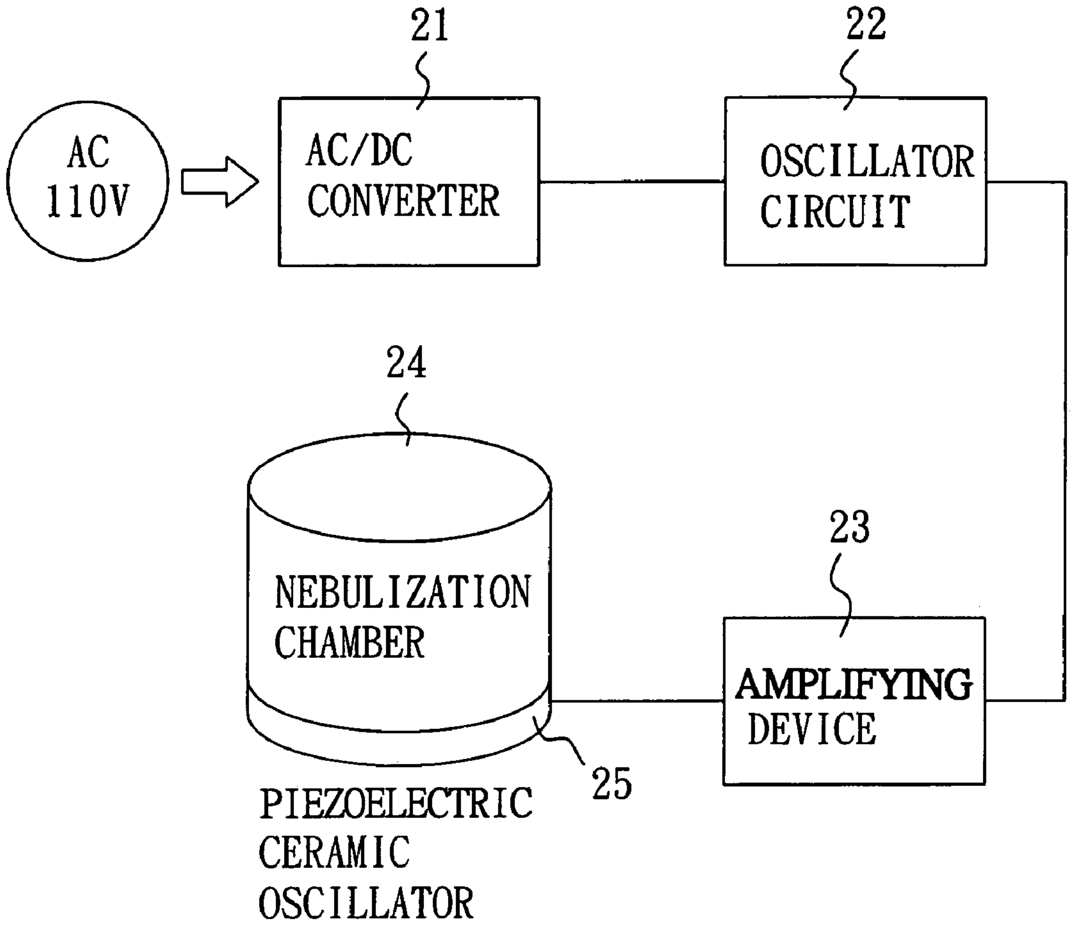
FIG. 2 shows a block diagram of an ultrasonic nebulizer for producing high-volume sub-micron droplets in accordance with the present invention.

With reference to FIG. 2, there is shown a preferred embodiment of an ultrasonic nebulizer for producing high-volume sub-micron droplets, which comprises an ac/dc converter 21, an oscillator circuit 22, an amplifying device 23, a nebulization chamber 24, and at least one piezoelectric ceramic oscillator 25.

The ac/dc converter 21 rectifies an ac current to a dc current for providing a dc voltage to the oscillator circuit 22. The oscillator circuit 22 powered by the dc voltage produces an oscillation signal with a frequency larger than or equal to 3 MHz. The preferred frequencies of the oscillation signal in the present embodiment are 3 MHz or 5 MHz. The amplifying device 23 is connected to the oscillator circuit 22 for amplifying the oscillation signal. The nebulization chamber 24 has a lower face for holding a liquid to be nebulized. At least one piezoelectric ceramic oscillator 25 is formed on the lower face of the nebulization chamber 24 and electrically connected to the amplified signal providing an ultrasonic output to cause nebulization for producing high-volume sub-micron droplets.

Figure 3:
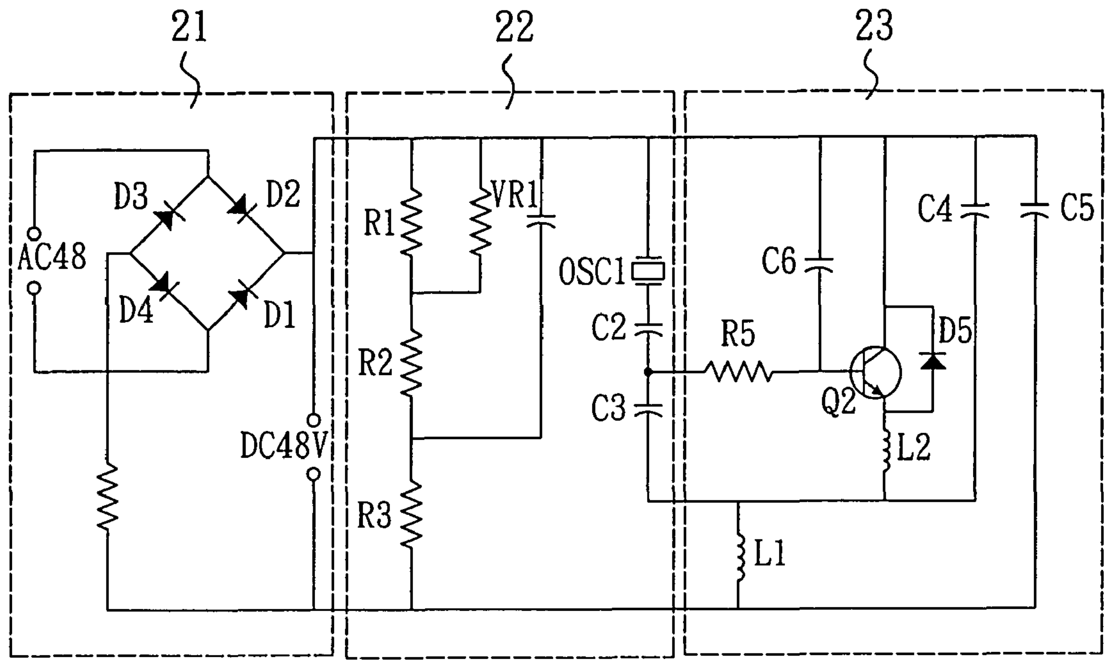
FIG. 3 shows a circuit of the ultrasonic nebulizer for producing high-volume sub-micron droplets in accordance with the present invention.

FIG. 3 shows a circuit of the ultrasonic nebulizer for producing high-volume sub-micron droplets in accordance with the present invention. As shown, the ac/dc converter 21 comprises four diodes D1~D4, and a resistor R6 to form a Whetstone bridge and rectifies an ac current to a dc current for providing a dc voltage. The oscillator circuit 22 comprises a plurality of resistors R1~R3, a plurality of capacitors C1~C3, a variable resistor VR1 and an oscillator OSC1 for generating the oscillation signal. The amplifying device 23 comprises a resistor R5, a plurality of capacitors C4~C6, a plurality of inductances L1~L2, a diode D5, and a power amplified transistor Q2 for amplifying the oscillation signal of the oscillator circuit 22. Thus, the piezoelectric ceramic oscillator 25 driven by the amplified oscillation signal oscillates at a specific frequency.

Figure 4:
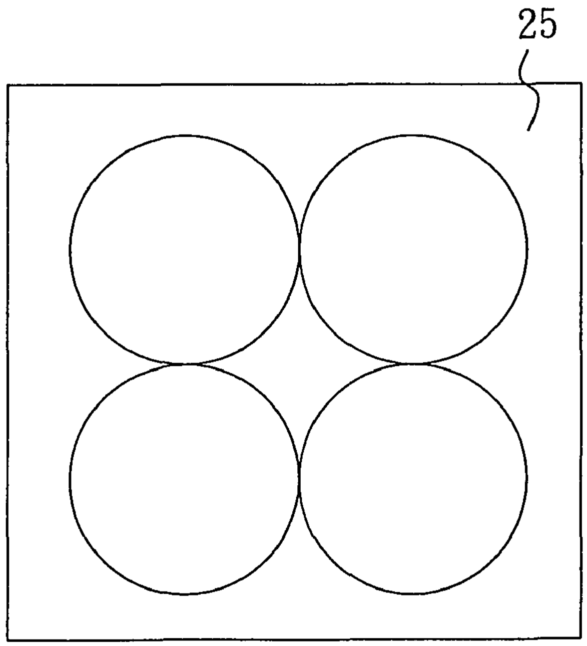
FIG. 4 shows an arrangement of the plurality piezoelectric ceramic oscillator in accordance with the present invention.

As shown in FIG. 3, if the oscillation frequency of oscillator OSC1 is 5 MHz, the oscillator circuit 22 will oscillate for generating a 5 MHz oscillation signal. Then, the oscillation signal amplified by the amplifying device 23 can drive the piezoelectric ceramic oscillator 25. The piezoelectric ceramic oscillator 25 also oscillates at 5 MHZ for producing a plurality of droplets with a 1.0 μm average diameter. The average size of the droplets at 5 MHz oscillation frequency is less than those produced at 1.6 MHz or 2.4 MHz oscillation frequencies. However, as shown in FIG. 4, at least one piezoelectric ceramic oscillator 25 is formed on the lower face of the nebulization chamber 24 and electrically connected to the amplified signal for producing high-volume sub-micron droplets. This arrangement can overcome the problem of insufficient droplets volume at 5 MHz oscillation frequency.

As aforementioned, the inventive ultrasonic nebulizer uses a 5 MHz oscillation frequency for producing the droplets with a 1.0 μm average diameter. Additionally, with the arrangement of at least one piezoelectric ceramic oscillator formed on the lower face of the nebulization chamber, the inventive ultrasonic nebulizer can produce high-volume sub-micron droplets.

Although the present invention has been explained in relation to its preferred embodiment, it is to be understood that many other possible modifications and variations can be made without departing from the spirit and scope of the invention as hereinafter claimed.

What is claimed is:

1. An ultrasonic nebulizer for producing high-volume sub-micron droplets, comprising:

an ac/dc converter for rectifying an ac current to a dc current and providing a dc voltage; an oscillator circuit powered by said dc voltage for producing an oscillation signal with a frequency larger than or equal to 3 MHz;

an amplifying device being connected to said oscillator circuit for amplifying the oscillation signal, wherein the amplifying device includes an NPN transistor having an emitter connecting a positive terminal of a diode and one terminal of a first inductor that has the other terminal connecting a negative terminal of a first capacitor and one terminal of a second inductor, a collector connecting a negative terminal of the diode, a positive terminal of the first capacitor, a positive terminal of the third capacitor and a positive terminal of a second capacitor that has a negative terminal connecting the other terminal of the second inductor, and a base connecting the oscillation signal through a resistor and a negative terminal of the third capacitor;

a nebulization chamber having a lower face for holding a liquid to be nebulized; and at least one piezoelectric ceramic oscillator formed on the lower face of said nebulization chamber and being electrically connected to the amplified signal to provide an ultrasonic output to cause nebulization for producing high-volume sub-micron droplets.

2. The ultrasonic nebulizer for producing high-volume sub-micron droplets as claimed in claim 1, wherein, the ac/dc converter comprises a register and four diodes forming a Whetstone bridge for rectifying the ac current.

3. The ultrasonic nebulizer for producing high-volume sub-micron droplets as claimed in claim 1, wherein, the oscillator circuit comprises a plurality of resistors, a plurality of capacitors, a variable resistor and an oscillator for producing the oscillation signal.

4. The ultrasonic nebulizer for producing high-volume sub-micron droplets as claimed in claim 1, wherein, the amplifying device comprises a resistor, a plurality of capacitors, a plurality of inductances, a diode, and a power amplified transistor for amplifying the oscillation signal.

5. The ultrasonic nebulizer for producing high-volume sub-micron droplets as claimed in claim 1, wherein, the frequency of the oscillation signal is equal to or large than 3 MHz.

* * * * *